(12) United States Patent
Clements

(10) Patent No.: US 6,634,898 B2
(45) Date of Patent: Oct. 21, 2003

(54) SWITCH MECHANISM FOR ONLINE REPLACEMENT OF PCI CARDS

(75) Inventor: Bradley E Clements, Ft Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 254 days.

(21) Appl. No.: 09/918,670

(22) Filed: Jul. 30, 2001

(65) Prior Publication Data

US 2003/0022530 A1 Jan. 30, 2003

(51) Int. Cl.[7] ............................................... H01R 13/62
(52) U.S. Cl. ...................... 439/327; 439/911; 200/51.09
(58) Field of Search ........................ 439/61, 361, 327, 439/368, 911; 200/51.09, 51.1, 50.28, 50.01; 361/759, 760

(56) References Cited

U.S. PATENT DOCUMENTS 4,798,923 A * 1/1989 Barwick et al. ......... 200/50.01
6,127,639 A * 10/2000 Greco et al. ............ 439/911 X

* cited by examiner

Primary Examiner—Lynn Feild
Assistant Examiner—Son V. Nguyen

(57) ABSTRACT

A telecommunications server comprises a switch/larch mechanism for use in online removal or insertion of a peripheral card, such as a PCI card. A bulkhead is adapted for mating engagement with a bulkhead mounting bracket of the peripheral card when the peripheral card is installed in the switch/latch mechanism. A doorbell switch having a vertical range of motion is manually depressed to signal the server and commence an orderly shutdown of the peripheral card in advance of online replacement of the peripheral card. A panel switch provides a mechanical lock retaining the peripheral card in place, and also function as a backup power interrupt device to protect the peripheral card in the event that depression of the doorbell button does not result in an orderly shutdown of the peripheral card.

13 Claims, 5 Drawing Sheets

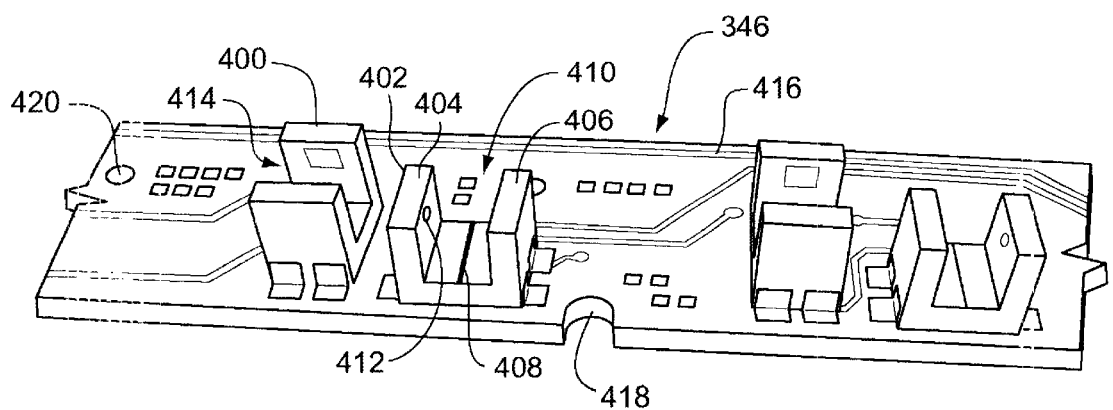
FIG. 4
FIG. 6
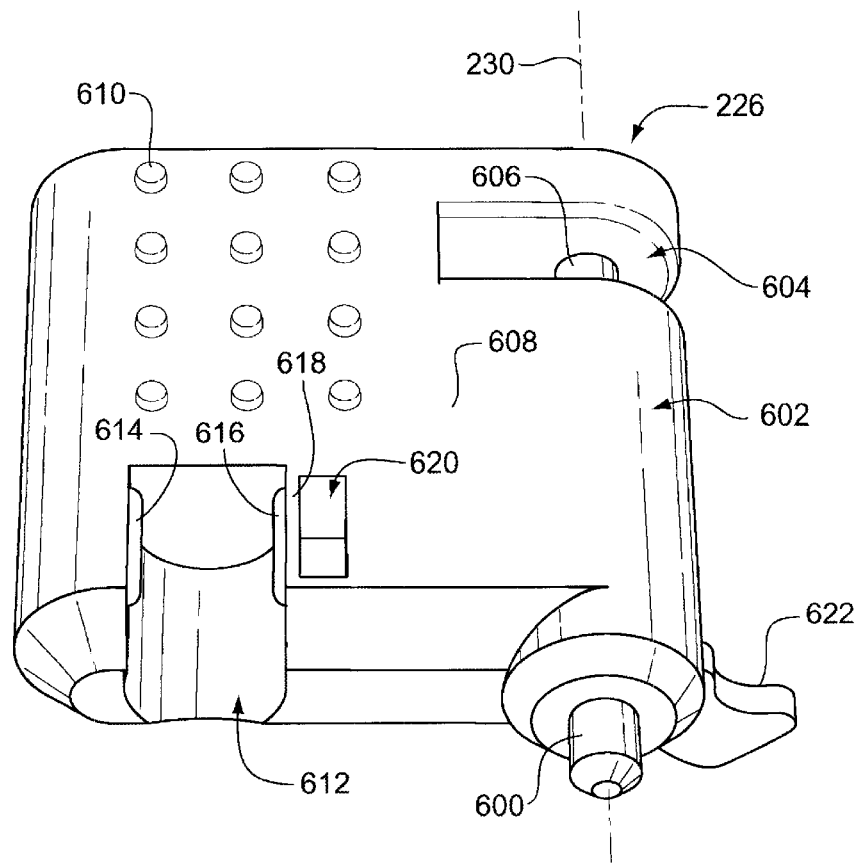

SWITCH MECHANISM FOR ONLINE REPLACEMENT OF PCI CARDS

BACKGROUND OF THE INVENTION

1. Field of the Invention

The invention pertains to the field of switch mechanisms that facilitate online replacement of printed circuit board cards, such as peripheral component interface (PCI) cards. The switch mechanisms also function as a mechanical latch.

2. Discussion of the Related Art

Computer system maintenance, repair and upgrade operations frequently involve the insertion or replacement of expansion cards. For example, an expansion card that provides a specific functionality may be inserted into a PCI or ISA bus. This card may be replaced for a variety of reasons including system upgrades or failure of the card.

Standard operating procedures for the insertion or replacement of expansion cards have traditionally required the computer system to be shut-down or powered off during the insertion or replacement procedures. This requirement is problematic because the computer system is unavailable to fulfill its intended function during the procedure. The system unavailability is not necessarily a problem is some cases, however, unavailability causes severe disruptions in other cases. For example, in the case of a telecommunications server that supports a large number of clients, even temporary unavailability of the server may cause extreme inconvenience to the client base.

One solution to the problem of having to shut down computer systems for maintenance is to provide an online or hot-swapping capability that permits the insertion and removal of expansion cards while the system is operational. For example, U.S. Pat. No. 5,568,610 teaches the use of capacitive plates coupled to corresponding variable frequency oscillators that, in combination, detect the insertion or removal of an expansion card. U.S. Pat. No. 6,252,514 describes a sliding lock assembly coupled with a detector that is capable of notifying the system when the lock assembly is engaged or disengaged, in order to prepare the system for selective insertion or removal of an expansion card. Similarly, U.S. Pat. No. 6,247,080 describes a method of hot-swapping peripheral adapters A current industry trend is to provide two switches for the hot-swapping or online replacement of PCI cards. A first switch is known as a "doorbell" switch that an operator manually depresses to notify the system that the card is to be removed. The system, as needed, then saves states and commences an orderly shutdown of either the individual card. A second switch is used to unlatch the card from its location inside the chassis and, if the card is still under power at the time of unlatching, sends a signal that require the system to shut off power to the card before electrical damage can occur to the card.

While mechanisms and methods for the hot-swapping of expansion cards or peripheral adapters are known in the art, various problems arise in connection with the use of known mechanisms. For example, mechanisms that require the provision of a hole in a computer chassis or housing also produce a corresponding electromagnetic interference leak emanating from the hole. Furthermore, the layout of the switches and latching mechanisms is often ergonomically inconvenient.

There remains a need to provide an ergonomically improved switch and latch mechanism for use in online replacement of PCI cards and other expansion cards, that does not require openings which result in an EMI leak, and occupies only a small footprint.

SUMMARY OF THE INVENTION

The present invention overcomes the problems that are outlined above by providing an improved switch/latch mechanism which presents itself for easy viewing during use during online replacement of PCI cards and other expansion cards, does not require openings which result in an EMI leak, and occupies a small footprint.

The switch/latch mechanism according to the various embodiments and instrumentalities described herein retains a generally planar printed circuit board having a forward end, a rearward end, and an L-shaped bulkhead mounting bracket. The L-shaped mounting bracket has a first bracket segment that is connected to the forward end of the printed circuit board, and a second bracket segment extending forward of the first segment.

In an embodiment that is further described below, the switch/latch mechanism comprises a bulkhead adapted for mating engagement with the bulkhead mounting bracket of the peripheral card when the peripheral card is installed in the switch/latch mechanism. The bulkhead includes a first bulkhead wall that is oriented in parallel to the first bracket segment, and a second bulkhead wall that is oriented in parallel to the second bracket segment when the peripheral card is installed in the switch/latch mechanism. The second bulkhead wall includes an alignment pin for use in positioning the second bracket segment on the second bulkhead wall. A switch housing is deployed on a forward end of the second bulkhead wall. The switch housing includes a first switch wall parallel to the first bulkhead wall, and a second switch wall parallel to the second bulkhead wall. A paddle switch is mounted on the switch housing through use of a hinge axis that permits the paddle switch to travel in an arcuate path of motion over the second bulkhead wall. The hinge axis oriented in parallel to the first switch wall, so that the arcuate path of motion extends between a locked position of normal operation engaging the alignment pin, and an interrupt position remote from the alignment pin. A doorbell switch is mounted in the second switch wall and has a range of motion perpendicular to the second switch wall between an extended position of normal use and a compressed position.

In particularly preferred embodiments, the paddle switch includes a flag arm and a first optical switch component internal to the switch housing. The first optical switch component has a first slot permitting passage of the flag arm for optical interrupt purposes when the paddle switch is in one of the locked position of normal operation engaging the alignment pin and the interrupt position remote from the alignment pin. The paddle switch may include a snap mechanism for engaging the alignment pin when the panel switch is placed in the locked position of normal operation.

The doorbell switch has an interrupt arm and a second optical switch component internal to the switch housing. The second optical switch component has a second slot permitting passage of the interrupt arm for optical interrupt purposes when the doorbell switch is in one of the extended position of normal use and the compressed position. The doorbell switch may also comprise an integrally formed spring biasing the doorbell switch into the extended position of normal use.

The first slot and the second slot may be placed in transverse orientation with respect to one another, to provide an extremely compact assembly that occupies a very small footprint. The compact assembly permits the system chassis to occupy a lower vertical profile or, for example, the same profile may now contain an air venting structure, such as a perforated wall rising above the switch housing.

The switch/latch mechanism preferably includes a plurality of paddle switch and doorbell switch pairs attached to the switch housing. Each pair is allocated to a corresponding peripheral bus.

The switch housing may be advantageously formed using a modular construction comprising successive units each capable of housing a portion of the plurality of paddle switch and doorbell switch pairs. The successive units may, for example, comprise clip latch structure for engaging the second bulkhead wall to retain the successive units in fixed location with respect to one another.

DESCRIPTION OF THE DRAWINGS

FIG. 4 is a bottom, rear perspective view of the printed circuit board showing a deployment of two optical switch components in transverse orientation to one another;

FIG. 6 is a bottom side perspective view of a paddle switch body.

DETAILED DESCRIPTION OF THE EMBODIMENTS

Figure 1:
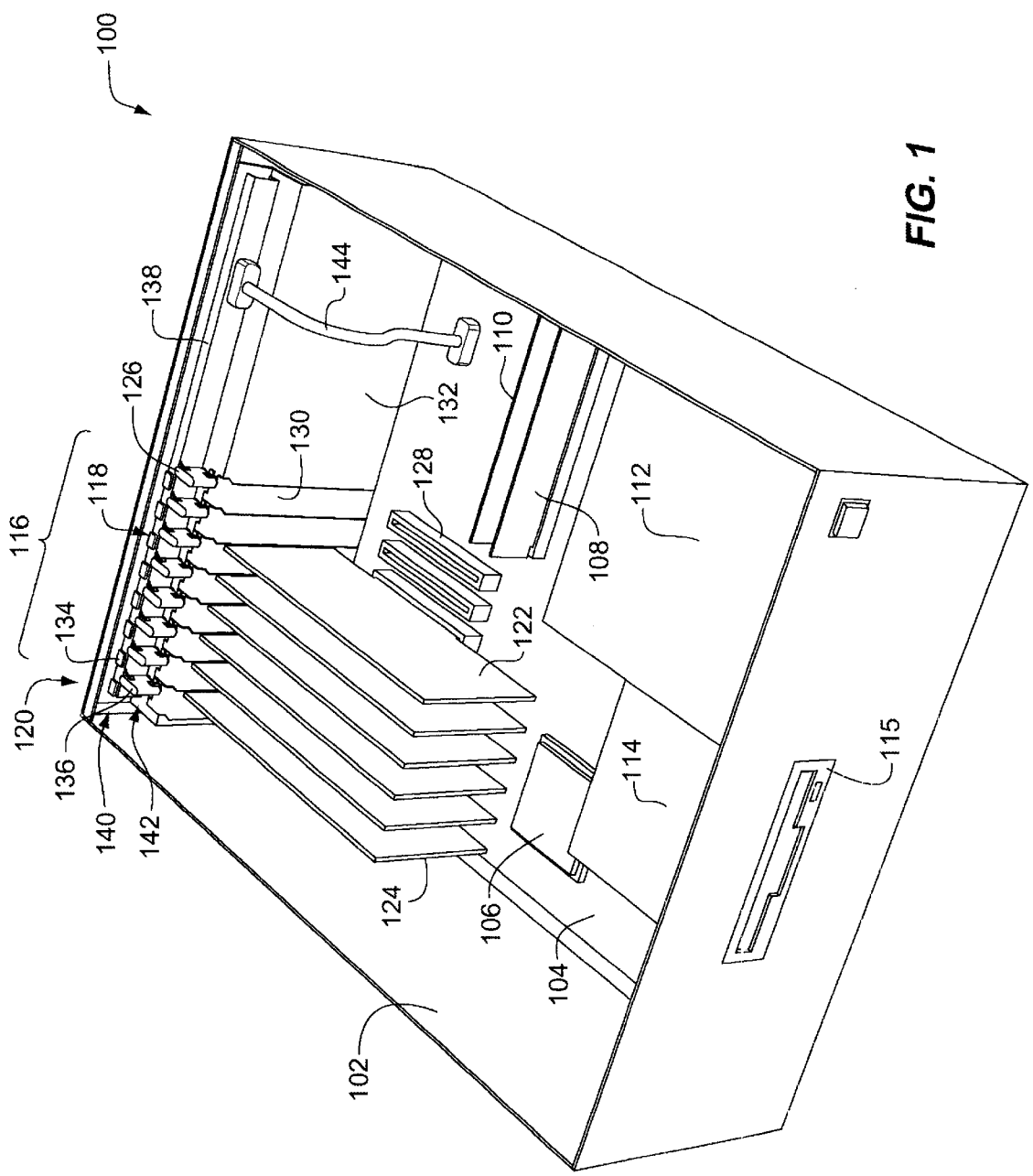
FIG. 1 is a top, rear perspective view showing a telecommunications server that incorporates a switch/latch mechanism according to the instrumentalities described herein.

FIG. 1 depicts a telecommunications server 100 that resides in a chassis 102. The top portion of chassis 102 has been removed to reveal internal components, such as a motherboard 104 that contains a processor 106, RAM banks 108 and 110, a power supply 112, and a drive bay 114 that may house, for example, a CD-ROM drive 115, as well as other storage media, such as a hard drive (not shown). The components that have been described thus far are conventional components, and are only shown to describe, in a general sense, an intended environment of use for a bank 116 of switch/latch mechanisms, such as switch/latch mechanisms 118 and 120. Apart from the bank 116, the telecommunications server 100 could be any other conventional electronic system, such as a network server, personal computer, or laboratory test instrumentation that utilizes expansion cards or peripheral cards, such as cards 122 and 124. Each of these peripheral cards may, for example, be allocated to a telecommunications channel.

Each of the switch/latch mechanisms, such as such as switch/latch mechanisms 118 and 120, are allocated to a corresponding bus. For example, as shown in FIG. 1, a switch/latch mechanism 126 is allocated to a bus 128, which may be any type of bus but is preferably a PCI bus. As shown in FIG. 1, bus 128 does not contain a peripheral card, and a sheet metal blank 130 seals an opening in bulkhead 132 of the type that permits access to a peripheral card that may be installed in bus 128. The switch/latch mechanisms 118 and 120 each include a pair of switches comprising a doorbell switch and a paddle switch team. For example, one such team comprising switch/latch mechanism 120 includes a doorbell switch 134 and a paddle switch 136, which are allocated to peripheral card 124. A switch housing 138 supports a doorbell switch array 140 and a paddle switch array 142. An interface cable 144 connects the doorbell switch array 140 and the paddle switch array 142 to the motherboard 104 for the transmission of operation control signals.

Operation of the telecommunication server 100 permits online replacement or "hot-swapping" of peripheral cards. Protocols for online replacement of peripheral cards are programmed into conventional device manageability control software and firmware. For example, an operator intending to replace peripheral card 124 may depress doorbell switch 134, which sends a signal to the telecommunications server 100 requiring a save of operational states in peripheral card 124, as well as a graceful shutdown of the functions being performed by peripheral card 124. The telecommunications server 100 also switches to interrupt system power servicing peripheral card 124 to complete the graceful shutdown procedure. Paddle switch 136 is a mechanical interlock that selectively retains peripheral card 124 in a fixed position or may be opened to permit removal of the peripheral card 124. Opening of paddle switch 136 also provides an immediate power interrupt that disrupts the operation of peripheral card 124 without a graceful shutdown if depression of the doorbell switch 134 has not disrupted power to peripheral card 124. Disruption of power to peripheral card 124 is required to avoid electronic damage, otherwise, arising from power continuity during online replacement.

With power to peripheral card 124 disrupted, the operator is free to remove peripheral card 124 and, optionally, replace peripheral card 124 with another peripheral card. Subsequent closure of the paddle switch 136 followed by depression of the doorbell switch 134 permits the telecommunications server 100 to use the new peripheral card in place of peripheral card 124, e.g., by restoring the saved states of peripheral card 124 to the new peripheral card.

Figure 2:
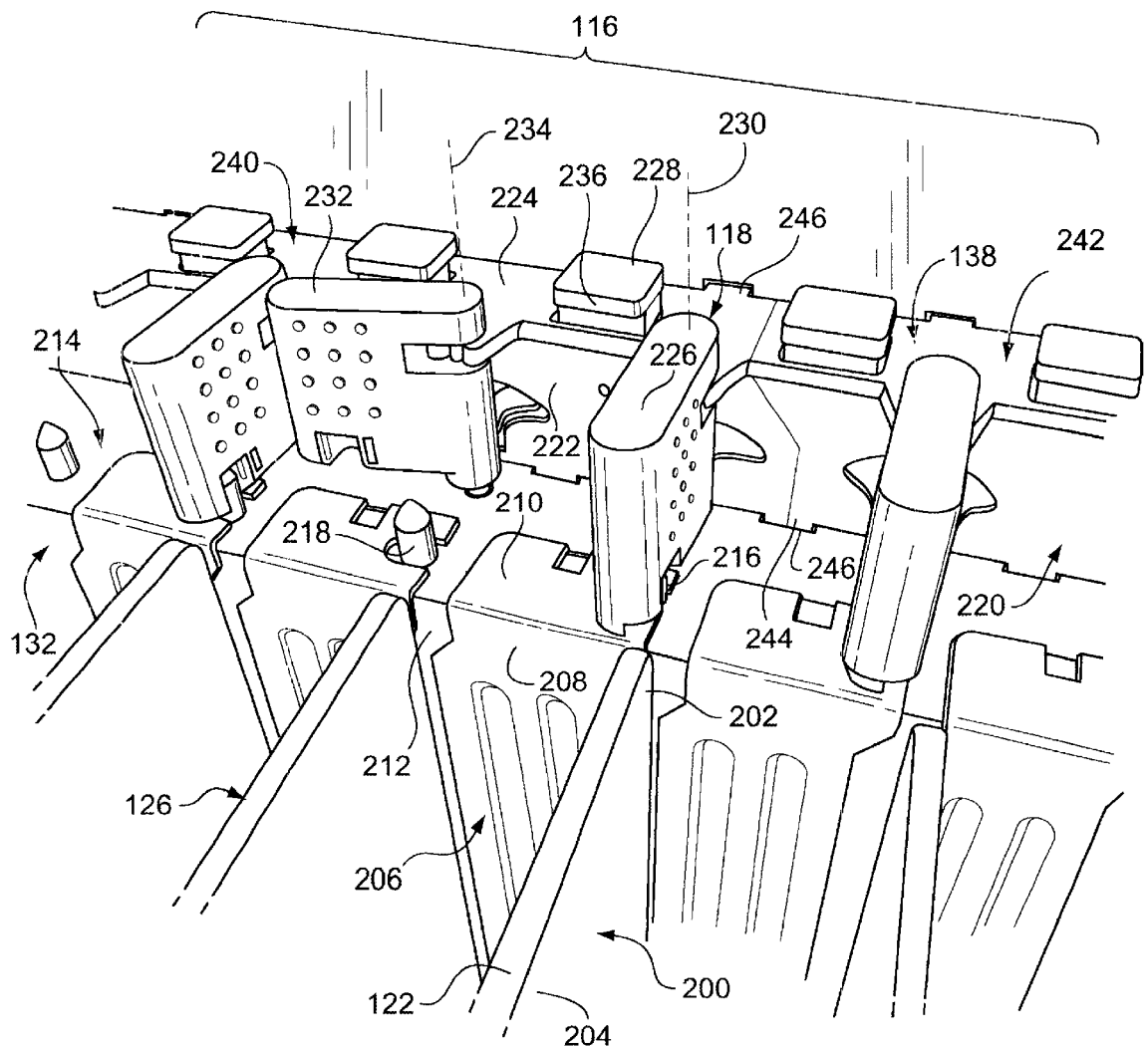
FIG. 2 is a top, rear perspective view providing additional detail with respect to the switch/latch mechanism.

FIG. 2 provides additional detail relating to the construction of bank 116. The Peripheral card 122 comprises a generally planar printed circuit board 200 having a forward end 202 and a rearward end 204. An L-shaped bulkhead mounting bracket 206 has a first bracket segment 208 connected to the forward end 202 of the printed circuit board 200, and a second bracket segment 210 extending forward of the first segment 208.

The switch/latch mechanism 118 comprises the bulkhead 132, which is adapted for mating engagement with the bulkhead mounting bracket 206 of the peripheral card 122 when the peripheral card 122 is installed in the switch/latch mechanism. The bulkhead 132 includes a first bulkhead wall 212 oriented in parallel to the first bracket segment 208 and a second bulkhead wall 214 oriented in parallel to the second bracket segment 210 when the peripheral card 122 is installed in the switch/latch mechanism 118. The second bulkhead wall 214 includes an alignment pin 216 (see also pin 218 associated with neighboring paddle switch) for use in positioning the second bracket segment 210 on the second bulkhead wall 214.

The switch housing 138 is deployed on a forward end 220 of the second bulkhead wall 214. The switch housing includes a first switch wall 222 parallel to the first bulkhead wall 212 and a second switch wall 224 parallel to the second bulkhead wall 214.

The switch/latch mechanism 118 includes a paddle switch 226 and a doorbell switch 228. The paddle switch 226 is mounted on the switch housing 138 through use of a hinge axis 230 that permits the paddle switch 226 to travel in an arcuate path of motion over the second bulkhead wall 214. The hinge axis 230 is oriented in parallel relationship to the first switch wall 222 and in perpendicular relationship to the second bulkhead wall 214. The arcuate path of motion for paddle switch 226 extends between a locked position of normal operation above second bracket segment 210 and engaging the alignment pin 216, as shown for paddle switch 226 in FIG. 2, and an interrupt position remote from the alignment pin 216; as shown by analogy to an identical paddle switch 232 that has been pivoted on hinge axis 234 to occupy an interrupt position in relationship to pin 218. Peripheral card 126 may be removed without interference from paddle switch 226 when paddle switch 226 is rotated to the interrupt position.

The doorbell switch 228 is mounted in the second switch wall 224 and has a range of motion perpendicular to the second switch wall between the extended position of normal use, as shown in FIG. 2, and a compressed position where lip 236 abuts the second switch wall 224.

The arrangement of identical teamed pairs of paddle switches and doorbell switches, in identical manner with respect to switch/latch mechanism 118, provides an extremely compact structure that occupies a minimal footprint over dimensions of rise, width and depth. Accordingly, it is possible to enhance system cooling by the provision of a perforated wall 238 that rises above switch housing 138. Alternatively, the perforated wall 238 may be eliminated to reduce the vertical profile of telecommunications server 100.

An especially preferred but optional feature of the switch housing 138 is a modular construction comprising successive units 240 and 242 each capable of housing a portion of the plurality of paddle switch and doorbell switch pairs. The successive units 240 and 242 comprise clip-latch structure 244, 246 for engaging the second bulkhead wall 214 and the perforated wall 238 to retain the successive units 240 and 242 in fixed location with respect to one another.

Figure 3:
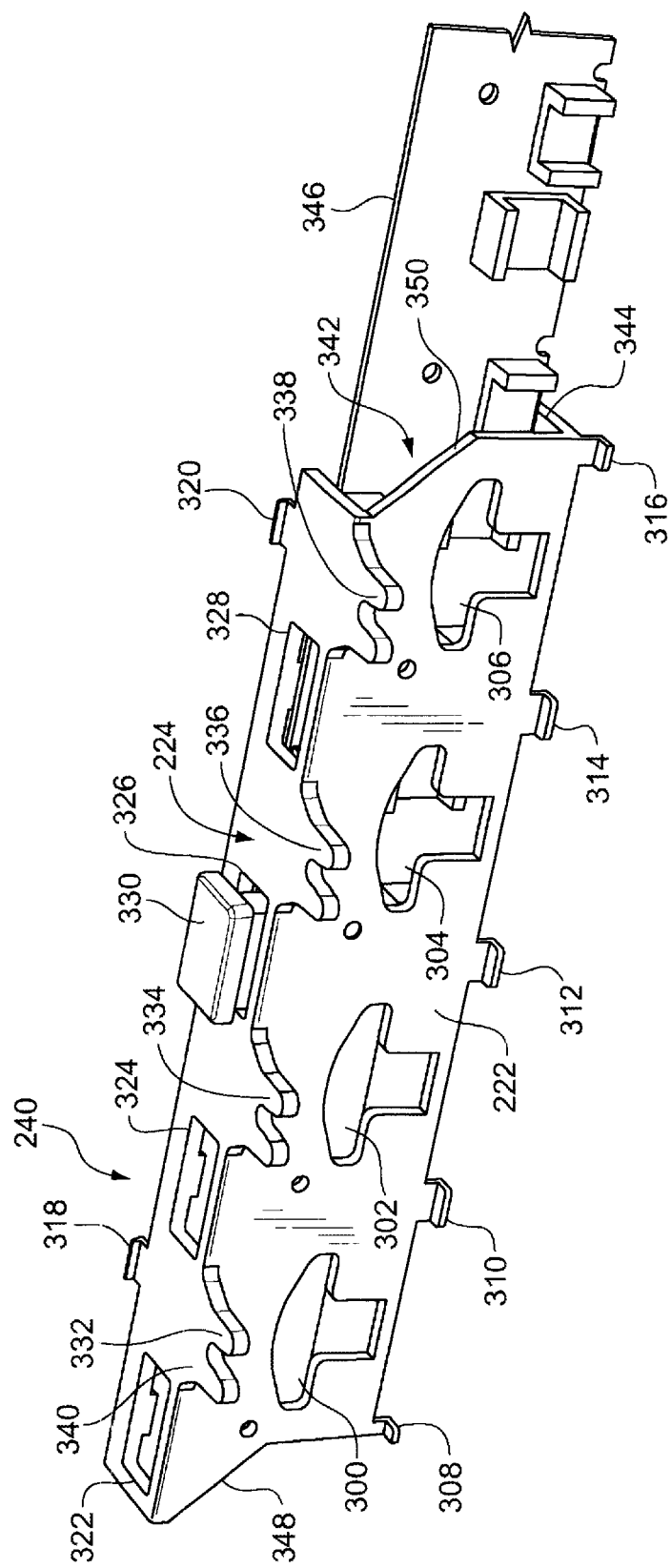
FIG. 3 is a rear perspective view showing a switch housing component and a printed circuit board for use in the switch/latch mechanism.

FIG. 3 provides additional detail with respect to unit 240 of switch housing 138. The first switch wall 222 defines a plurality of mushroom-shaped openings 300, 302, 304, and 306, that permit passage of components of the paddle switches, such as paddle switches 226 and 232 shown in FIG. 2. A series of downwardly extending male protrusions 308, 310, 312, 314, and 316, engage complimentary female structure on the second bulkhead wall 214, as shown in FIG. 2. Forwardly extending snap clips 318 and 320 engage the perforated wall 238, as shown in FIG. 1, to retain the unit 240 in place. The second switch wall 224 defines square apertures 322, 324, 326 and 328 for receipt of doorbell buttons, such as doorbell button 330. Ears 332, 334, 336, and 338 each include a flexible snap slot, such as snap slot 340, which is used to connect with a corresponding paddle switch, such as paddle switch 226 or 232, as shown in FIG. 1. A forward facing channel slot recess 342 defined by the first switch wall 222, the second switch wall 224, and a third wall 344. An elongated printed circuit board 346 snaps into the channel slot recess 342 and is there fixedly retained.

Beveled ends 348 and 350 are have complimentary structure such that a plurality of identical units may be placed end to end. Thus, a single unit 240 may be used in telecommunications servers having four, eight, twelve, sixteen or other multiples of four switch/latch mechanisms. Accordingly, in a large-scale production environment there is no need to manufacture and inventory different switch housings for the different servers because a single type of housing unit, such as unit 240, provides a modular construction that meets the need of all of the servers.

FIG. 4 provides additional detail with respect to the printed circuit board 346. While any type of switch, such as electrical contact switches may be used, a pair of identical optical switch components 400 and 402 are preferably used to enhance reliability of these switch components in operation. As shown in the case of switch component 402, legs 404 and 406, in combination with bight 408, form a slot 410. The optical switch component 402 contains an internal LED or laser diode 412 that emits light traveling from leg 402 to leg 404. A complimentary photodetector (not shown) in leg 404 provides a continuous signal in response to emissions from diode 412 unless slot 410 is blocked by an obstruction. Slot 410 has a transverse orientation with respect to the axis of elongation in printed circuit board 346 and is used to accommodate a doorbell switch, such as doorbell switch 330 shown in FIG. 3. Slot 414 has a parallel orientation with respect to the axis of elongation in printed circuit board 346 and is used to accommodate a paddle switch, such as paddle switch 226 shown in FIG. 2. Metallized leads, such as lead 416, operably interconnect the respective components of printed circuit board 346. Slot 418 mates with a complimentary nib structure (not shown) on the third wall 344 of unit 240 for retention of the printed circuit board 346 in channel slot recess 342, as depicted in FIG. 3. Holes, such as hole 420 are used to engage the doorbell switches, as described in the context of FIG. 5.

Figure 5:
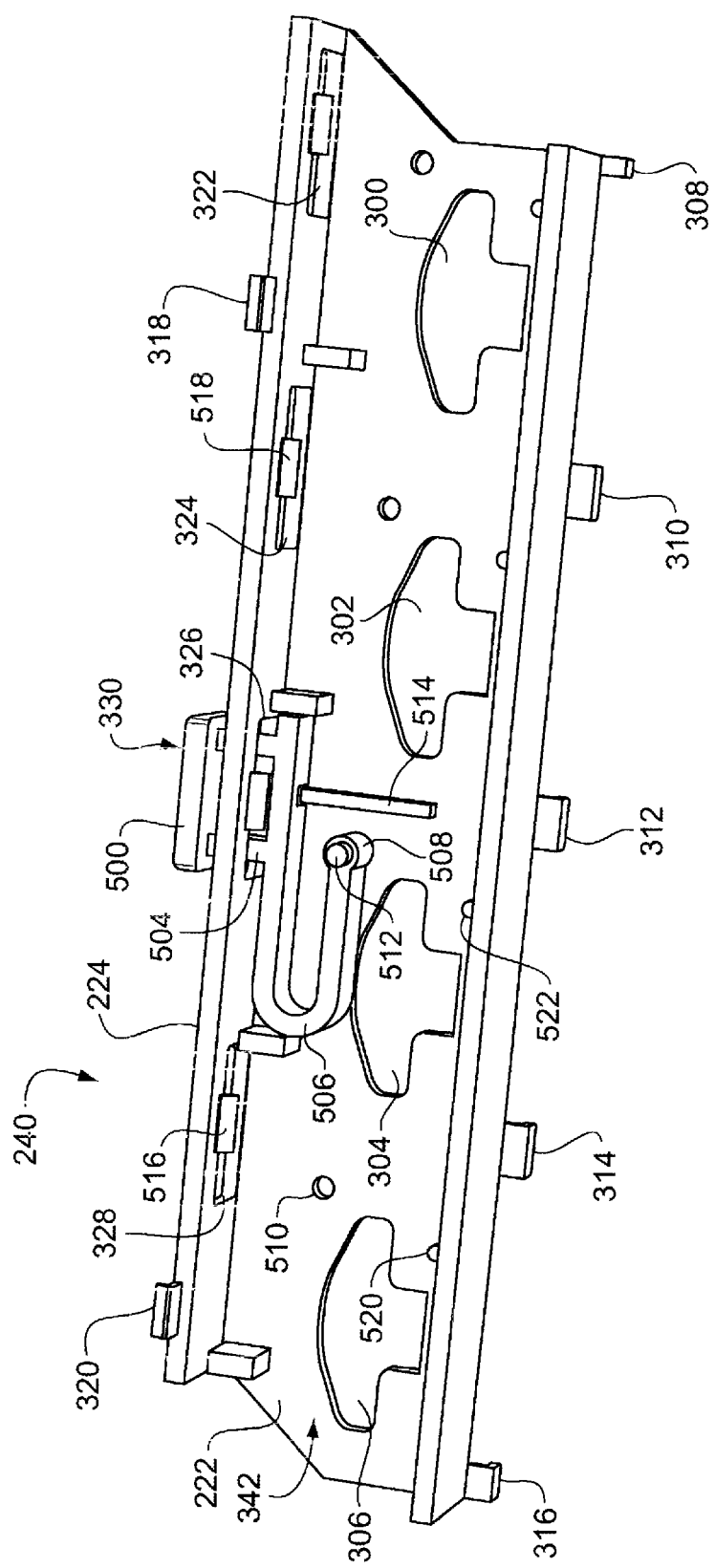
FIG. 5 is a bottom, front perspective view of the switch housing component showing partial installation of a doorbell switch component.

FIG. 5 provides additional detail showing the doorbell button 330 mounted in square aperture 326 from a forward perspective revealing channel slot recess 342. Doorbell switch 330 comprises an uppermost table 500 having areal dimensions larger than those of square aperture 326. A neck section 504 connects the table 500 with an integrally formed U-spring 506 having a distal end formed as a pivot rod member 508. One end of the pivot rod member 508 fits into a hole, such as hole 510, and another end 512 fits into a hole in printed circuit board 346, such as hole 420 shown in FIG. 4. Thus, U-spring 506 is able to exert upward bias on neck segment 504 and table 500 in compression against rod member 508 extending between first switch wall 222 and the printed circuit board 346. An interrupt arm 514 is positioned for insertion into slot 410 (see FIG. 4) with disruption of the optical pathway between legs 404 and 406 by the downward motion of interrupt arm 514 in slot 410 against the bias of U-spring 506. Snap retainers 516 and 518 extend downwardly from second switch wall 224 and deform to accept printed circuit board 346 into channel slot recess 342. Printed circuit board 346 is positionally indexed to align slot 410 with interrupt arm 514 by a plurality of indexing studs, such as studs 520 and 522, rising from third wall 344. In preferred embodiments, all of the doorbell switches are identical to doorbell switch 330.

FIG. 6 provides additional detail with respect to paddle switch 226, which is also shown in FIG. 2. In preferred embodiments, all of the paddle switches are identical to paddle switch 226. A hinge pin 600 defines the hinge pivot axis 230. The hinge pin 600 includes a lower male segment 602 extending beneath a panel body 602. This lower male segment 602 is received into a complementary female opening in the second bulkhead wall 214, as shown in FIG. 2. The hinge pin 600 extends through panel body 602, which forms a forward facing slot 604 that reveals a clipable segment 606 of the hinge pin 600. This clipable segment 606 attaches to, for example, the snap slot 340 shown in FIG. 3. A panel surface 608, as well as a corresponding panel surface remote from panel surface 608, are textured with buttons 610 for ease of manual manipulation as panel body is pivoted about hinge pin 600. The panel body 602 forms a snap slot 612 incorporating snap ears 614 and 616. Snap ear 616 resides on a flexible sidewall 618 adjacent a recess 620, which improves the flexibility of flexible sidewall 618. The snap ears 614 and 616 resiliently deform to accommodate an alignment pin, such as pin 216 or 218 shown in FIG. 2, and retain the paddle switch 226 in locked position against vibrational forces during transit of the telecommunications server 100.

A flag arm 622 protrudes forward of panel body 602 and is radially offset with respect to hinge pivot axis 230 and panel body 602, such that rotation to a position of normal operation with alignment pin 216 (see also FIG. 2) received in slot 612 causes the flag arm 622 to move out of slot 414 (see also FIG. 4) with no optical interrupt in the slot 414. Rotation of panel body 602 to disengage alignment pin 216 from slot 414 causes flag arm 622 to move into slot 414 where flag arm 622 causes an optical interrupt.

The foregoing discussion is intended to illustrate the concepts of the invention by way of example with emphasis upon the preferred embodiments and instrumentalities. Accordingly, the disclosed embodiments and instrumentalities are not exhaustive of all options or mannerisms for practicing the disclosed principles of the invention. The inventors hereby state their intention to rely upon the Doctrine of Equivalents in protecting the full scope and spirit of the invention.

What is claimed is:

1. A switch/latch mechanism for use in online removal of a peripheral card from, or insertion into, an electronic system, comprising:

a switch housing including, a horizontal wall defining a doorbell switch opening and a vertical wall defining a paddle switch opening;

a doorbell switch operably mounted in the doorbell switch opening and operably configured to signal the system to save and restore operational states in the card during power interruption and restoration, respectively; and a paddle switch operable between an open and closed position for selective retention of the card in the system, mounted to pivot on a vertical axis proximate the paddle switch opening, the paddle switch having a flag arm protruding through the paddle switch opening and the arm operable to interrupt power to the card if the paddle switch is moved to open position.

2. The switch/latch mechanism of claim 1, including:

a generally planar printed circuit board having a forward end and a rearward end, and an L-shaped bulkhead mounting bracket having a first bracket segment connected to the forward end of the printed circuit board, and a second bracket segment extending forward of the first segment;

a bulkhead adapted for mating engagement with the bulkhead mounting bracket of the peripheral card when the peripheral card is installed in the switch/latch mechanism, the bulkhead including a first bulkhead wall oriented in parallel to the first bracket segment and a second bulkhead wall oriented in parallel to the second bracket segment when the peripheral card is installed in the switch/latch mechanism; and the second bulkhead wall including an alignment pin for use in positioning the second bracket segment on the second bulkhead wall.

3. The switch/latch mechanism of claim 2, comprising:

the switch housing deployed on a forward end of the second bulkhead wall, the vertical wall of the switch housing in parallel to the first bulkhead wall, and the horizontal wall of the switch housing in parallel to the second bulkhead wall.

4. The switch/latch mechanism of claim 3, wherein:

the hinge axis of the paddle switch permits the paddle switch to travel in an arcuate path of motion over the second bulkhead wall; and the arcuate path of motion extends between a locked position of normal operation engaging the alignment pin and an interrupt position remote from the alignment pin.

5. The switch/latch mechanism of claim 4, wherein the paddle switch includes a snap mechanism for engaging the alignment pin when the panel switch is placed in the locked position of normal operation.

6. The switch/latch mechanism of claim 1, wherein the doorbell switch has a range of motion perpendicular to the horizontal wall between an extended position of normal use and a compressed position.

7. The switch/latch mechanism of claim 1, wherein the paddle switch comprises:

a first optical switch component internal to the switch housing, the first optical switch component having a first slot permitting passage of the flag arm for optical interrupt purposes.

8. The switch/latch mechanism of claim 6, wherein the doorbell switch comprises an interrupt arm and a second optical switch component internal to the switch housing, the second optical switch component having a second slot permitting passage of the interrupt arm for optical interrupt purposes.

9. The switch/latch mechanism of claim 8, wherein the first slot has a transverse orientation with respect to the second slot.

10. The switch/latch mechanism of claim 1, wherein the doorbell switch comprises an integrally formed spring.

11. The switch/latch mechanism of claim 1, further comprising a plurality of paddle switch and doorbell switch pairs attached to the switch housing, each pair allocated to a corresponding peripheral bus.

12. The switch/latch mechanism of claim 11, wherein the switch housing has a modular construction comprising successive units each capable of housing a portion of the plurality of paddle switch and doorbell switch pairs.

13. The switch/latch mechanism of claim 12, wherein the successive units comprise clip latch structure for engaging the second bulkhead wall to retain the successive units in fixed location with respect to one another.

* * * * *